(12) United States Patent
Zhu et al.

(10) Patent No.: US 11,569,191 B2
(45) Date of Patent: Jan. 31, 2023

(54) MULTI-FEED PACKAGED ANTENNA BASED ON FAN-OUT PACKAGE

(71) Applicant: 38TH RESEARCH INSTITUET, CHINA ELECTRONICS TECHNOLOGY GROUP CORPORATION, Anhui (CN)

(72) Inventors: Chuanming Zhu, Anhui (CN); Zongming Duan, Anhui (CN); Yuefei Dai, Anhui (CN)

(73) Assignee: 38TH RESEARCH INSTITUET, CHINA ELECTRONICS TECHNOLOGY GROUP CORPORATION, Hefei (CN)

(*) Notice: Subject to any disclaimer, the term of this patent is extended or adjusted under 35 U.S.C. 154(b) by 0 days.

(21) Appl. No.: 17/206,479

(22) Filed: Mar. 19, 2021

(65) Prior Publication Data
US 2022/0246571 A1 Aug. 4, 2022

(30) Foreign Application Priority Data

Jan. 29, 2021 (CN) .......................... 202110125247.6

(51) Int. Cl.
*H01L 23/00* (2006.01)
*H01L 23/66* (2006.01)
*H01Q 1/22* (2006.01)

(52) U.S. Cl.
CPC .............. *H01L 24/24* (2013.01); *H01L 23/66* (2013.01); *H01L 24/25* (2013.01); *H01L 24/73* (2013.01); *H01Q 1/2283* (2013.01); *H01L 24/16* (2013.01); *H01L 2223/6627* (2013.01); *H01L 2223/6677* (2013.01); *H01L 2224/16225* (2013.01);

(Continued)

(58) Field of Classification Search
CPC ......... H01L 24/24; H01L 23/66; H01L 24/25; H01L 24/73; H01L 24/16; H01L 2223/6627; H01L 2223/6677; H01L 2224/16225; H01L 2224/24265; H01L 2224/25171; H01L 2224/73209; H01L 23/3107; H01Q 1/2283; H01Q 1/40; H01Q 9/0407; H01Q 1/38; H01Q 1/50
See application file for complete search history.

(56) References Cited

U.S. PATENT DOCUMENTS

2010/0193935 A1* 8/2010 Lachner .................. H01L 24/12
257/693

FOREIGN PATENT DOCUMENTS

CN 107068659 A 8/2017
CN 109244641 A 1/2019
(Continued)

*Primary Examiner* — Jasmine J Clark

(57) ABSTRACT

A multi-feed packaged antenna based on fan-out package, which relates to packaged antennas. A first passivation layer is arranged under a packaging layer, and first and second redistribution layers are arranged on the first passivation layer to build the multi-feed packaged antenna. Connecting ends of multiple channels of a chip are connected to a feed structure of a packaged antenna. A metal layer of the feed structure is achieved by the first redistribution layer, and the second redistribution layer is mainly configured to package an antenna. The coaxial feed is adopted herein, in which two redistribution layers are provided, by which a multi-port power combining can be achieved on the antenna, providing a wide-beam performance.

8 Claims, 5 Drawing Sheets

(52) U.S. Cl.
  CPC ............... *H01L 2224/24265* (2013.01); *H01L 2224/25171* (2013.01); *H01L 2224/73209* (2013.01)

(56) References Cited

FOREIGN PATENT DOCUMENTS

| CN | 109411451 A | 3/2019 | | |
|---|---|---|---|---|
| WO | WO-2017091466 A1 | * | 6/2017 | ............. H01L 23/66 |

* cited by examiner

MULTI-FEED PACKAGED ANTENNA BASED ON FAN-OUT PACKAGE

CROSS-REFERENCE TO RELATED APPLICATIONS

This application claims the benefit of priority from Chinese Patent Application No. 202110125247.6, filed on Jan. 29, 2021. The content of the aforementioned application, including any intervening amendments thereto, is incorporated herein by reference in its entirety.

TECHNICAL FIELD

This application relates to packaged antennas, and more particularly to a multi-feed packaged antenna based on fan-out package.

BACKGROUND

The working wavelength of the antenna in the millimeter-wave or even terahertz frequency has reached a millimeter or sub-millimeter level, which makes it possible to integrate the millimeter-wave chip with an antenna in the package. Through the antenna-in-package (AIP) technology, the antenna and the millimeter-wave chip can be integrated in a package structure. The AIP technology comprehensively takes the antenna volume, performance and cost into account, facilitating realizing the micro-system wireless transmission.

As for the fan-out wafer level packaging (FOWLP), a required circuit is pulled out from an end of a semiconductor die to a redistribution layer in a wafer manufacturing, to complete the packaging process, which has a relatively low cost. With regard to the existing multi-feed antennas in which the multi-port power combining is performed based on the fan-out package, the multi-channel power combining is mainly performed on a printed circuit board, or the power combining of the antenna is achieved on a silicon substrate.

When the power combining on an antenna is performed based on the traditional fan-out package, the feeders will affect the radiation performance of the packaged antenna, causing a shift in the radiation pattern such that the radiation is no longer in the 0° direction. In addition, as the number of feeders increases, the packaged antenna will undergo continuous deterioration in the radiation performance.

SUMMARY

An object of this application is to provide a multi-feed packaged antenna based on fan-out package to solve the problem in the prior art that how to realize the multi-port power combining of a chip on a packaged antenna.

Technical solutions of the disclosure are described as follows.

This application provides a multi-feed packaged antenna based on fan-out package, comprising:
a packaging layer; and
a chip;
wherein the chip is embedded in the packaging layer; and a first passivation layer is provided on a side where a plurality of connecting ends of the chip are located;
the first passivation layer comprises a first redistribution layer and a second redistribution layer;
an antenna feed structure is provided in the first redistribution layer;
a packaged antenna is arranged in the second redistribution layer; and
the plurality of connecting ends of the chip are connected to the packaged antenna in the second redistribution layer through the antenna feed structure in the first redistribution layer.

In some embodiments, the antenna feed structure comprises a plurality of feeders corresponding to the plurality of connection ends of the chip; a first end of each of the plurality of feeders is connected to one of the plurality of connecting ends of the chip through a first via hole; and a second end of each of the plurality of feeders is connected to the packaged antenna through a second via hole.

In some embodiments, the packaged antenna is a dual-feed patch antenna, and two second via holes respectively connected to second ends of two feeders are symmetrically distributed with respect to a center line of the packaged antenna.

In some embodiments, the packaged antenna is a triple-feed patch antenna, and one of three via holes respectively connected to second ends of three feeders is arranged on a center line of the packaged antenna, and the other two via holes are symmetrically distributed with respect to the center line of the packaged antenna.

In some embodiments, the plurality of feeders are the same in length.

In some embodiments, the packaging layer is made of glass.

In some embodiments, an upper end surface of the packaging layer and the chip is covered with a second passivation layer.

In some embodiment, a solder ball array is provided on a lower end surface of the first passivation layer; solder balls in the solder ball array are arranged spaced apart; and the solder ball array is arranged around a periphery of the chip and the packaged antenna in a non-radiation direction.

In some embodiments, the solder ball array is connected to a metal line on an external printed circuit board.

Compared to the prior art, the multi-feed packaged antenna provided herein has the following beneficial effects.

In the disclosure, a first passivation layer is arranged below a packaging layer, and a first redistribution layer and a second redistribution layer are arranged on the first passivation layer to build the multi-feed packaged antenna. Connecting ends of multiple channels of a chip are connected to a feed structure of a packaged antenna. A metal layer of the antenna feed structure is achieved by the first redistribution layer, and the second redistribution layer is mainly configured to package the antenna. A coaxial feed method is adopted herein, in which two redistribution layers are provided with one layer used to for antenna in package and the other used for the feeders. A multi-port power combining can be achieved according to an electric field distribution of the antenna. A radiation pattern of the multi-feed packaged antenna is the same as that of a single antenna, having a wide-beam performance. In addition, a loss caused by a lossy power combiner is eliminated and the defect of insufficient working bandwidth is overcome, improving an effective isotropic radiated power of the system and reducing the system volume and cost.

BRIEF DESCRIPTION OF THE DRAWINGS

The disclosure will be described in detail below with reference to the accompanying drawings and embodiments to make technical solutions of the disclosure clearer. Obviously, presented in the accompanying drawings are merely some embodiments of this disclosure, and other embodiments made by those skilled the art without departing from the spirit of the disclosure should fall within the scope of the disclosure.

DETAILED DESCRIPTION OF EMBODIMENTS

Figure 1:
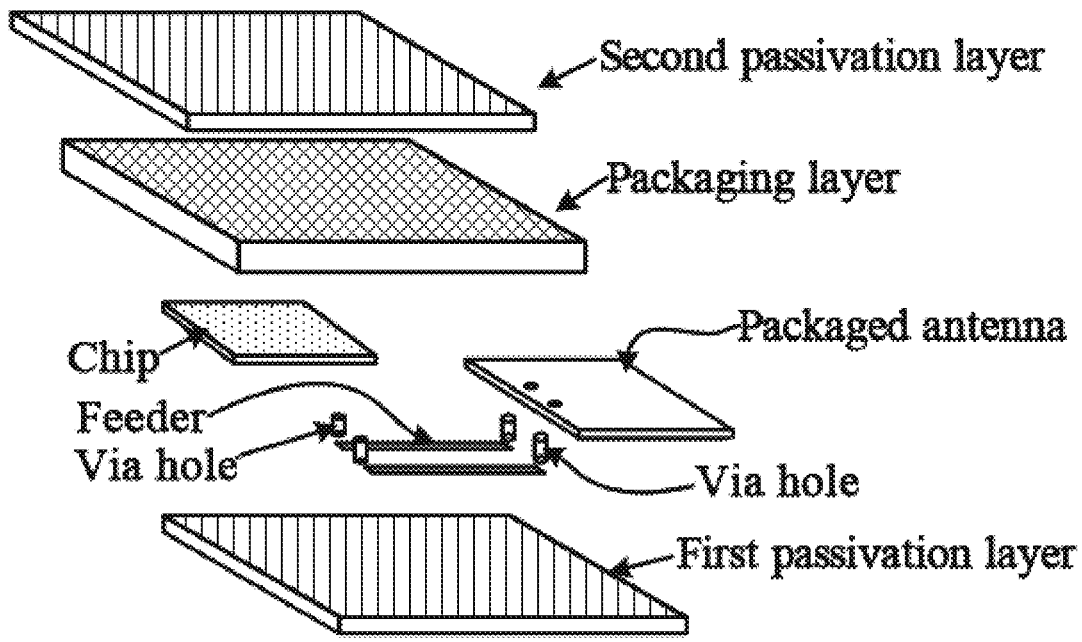
FIG. 1 is an explosive view of a dual-feed packaged antenna based on fan-out package in accordance with Embodiment 1 of the present disclosure.

The objects, technical solutions and beneficial effects of the present disclosure will be further described clearly with reference to the embodiments. Obviously, presented below are merely some embodiments of this disclosure, and are not intended to limit this disclosure. It should be understood that other embodiments made by those skilled in the art based on the content disclosed herein without sparing any creative effort should fall within the scope of the disclosure defined by the appended claims.

The present disclosure provides a multi-feed packaged antenna based on fan-out package, which realizes the multi-port power combining of a chip on a packaged antenna.

The design concept of the disclosure is described as follows. A first passivation layer is arranged below a packaging layer, and a first redistribution layer and a second redistribution layer are arranged on the first passivation layer to build the multi-feed packaged antenna. Connecting ends of multiple channels of a chip are connected to a feed structure of a packaged antenna. A metal layer of the antenna feed structure is achieved by the first redistribution layer, and the second redistribution layer is mainly configured to package the antenna. A coaxial feed method is adopted herein, in which two redistribution layers are provided with one layer used to realize the antenna and the other layer used for the feeders. In this way, the multi-port power combining can be achieved according to an electric field distribution of the antenna. On the one hand, a radiation pattern of the multi-feed packaged antenna is the same as that of a single antenna, having a wide-beam performance. In addition, a loss caused by a lossy power combine is eliminated and the defect of insufficient working bandwidth is overcome. On the other hand, the connecting ends of the chip are directly connected to a single antenna, and thus the working bandwidth of the connecting end is almost the same as that of the single antenna, effectively reducing the system volume and cost and improving an effective isotropic radiated power of the system.

The technical solutions of the disclosure will be further described clearly with reference to the accompanying drawings and embodiments.

The present disclosure provides a multi-feed packaged antenna based on fan-out package, realizing a multi-port power combining of a chip on a packaged antenna. The multi-feed packaged antenna includes a packaging layer and a chip.

The chip is embedded in the packaging layer, and a first passivation layer is provided on a side, at which a plurality of connecting ends of the chip are located.

The first passivation layer includes a first redistribution layer and a second redistribution layer.

An antenna feed structure is provided in the first redistribution layer.

A packaged antenna is arranged in the second redistribution layer.

The plurality of connecting ends of the chip are connected to the packaged antenna in the second redistribution layer through the antenna feed structure in the first redistribution layer.

The beneficial effects of the embodiment are described as follows.

A first passivation layer is arranged below a packaging layer, and a first redistribution layer and a second redistribution layer are arranged on the first passivation layer to build the multi-feed packaged antenna. Connecting ends of multiple channels of a chip are connected to a feed structure of a packaged antenna. A metal layer of the antenna feed structure is achieved by the first redistribution layer, and the second redistribution layer is mainly configured to package the antenna. A coaxial feed method is adopted herein, in which two redistribution layers are provided with one layer used to realize the antenna and the other layer used for the feeders. In this way, the multi-port power combining can be achieved according to an electric field distribution of the antenna. On the one hand, a radiation pattern of the multi-feed packaged antenna is the same as that of a single antenna, having a wide-beam performance. In addition, a loss caused by a lossy power combine is eliminated and the defect of insufficient working bandwidth is overcome. On the other hand, the connecting ends of the chip are directly connected to a single antenna, and thus the working bandwidth of the connecting end is almost the same as that of the single antenna, effectively reducing the system volume and cost and improving an effective isotropic radiated power of the system.

Embodiment 1

A dual-feed packaged antenna is provided herein, which is schematically shown in FIG. 1.

The dual-feed packaged antenna based on fan-out package includes a packaging layer, a chip and a packaged antenna.

The chip is a millimeter-wave chip, and is embedded in the packaging layer with a side on which connecting ends of the chip are emerged. In an embodiment, a lower end surface of the chip is level with a lower end surface of the packaging layer.

During the traditional fan-out package, the packaging layer is made of plastic, and the physical performance of the chip can be improved by using a thicker packaging material. However, the plastic material for fan-out package has high processing cost and large loss, and has a lager curvature compared to glass. In the millimeter-wave frequency band, the plastic will impact the radiation performance of antenna in package (AIP). Due to a larger loss angle tangent value than glass, the plastic will lead to a weakened antenna gain. Therefore, the packaging layer used herein is made of glass. Compared to the plastic, the glass has lower loss and processing cost, and has a smaller curvature, thereby largely improving the performance of the packaged antenna and reducing the microsystem cost.

A first passivation layer is provided on the side on which the connecting ends of the chip are located, so that the side and the packaging layer are covered with the first passivation layer.

Preferably, an upper end surface of the chip is level with a lower end surface of the packaging layer are located on the same plane. A second passivation layer is provided, so that the upper end surface of the packaging layer and the upper end surface of the chip are covered by the second passivation layer.

The first passivation layer includes a first redistribution layer and a second redistribution layer.

An antenna feed structure is provided in the first redistribution layer. A packaged antenna is arranged in the second redistribution layer. A plurality of connecting ends of the chip are connected to the packaged antenna in the second redistribution layer through the antenna feed structure in the first redistribution layer.

A solder pad of the chip is directly connected to the first redistribution layer through a via hole with a small height. If the antenna is placed on a top layer, due to the large height of the chip, the connection of the solder pad of the chip to the antenna on the top layer requires a via hole with a large height, resulting in a greater transition loss. By contrast, the fan-out package can effectively avoid such transition loss.

Figure 2:
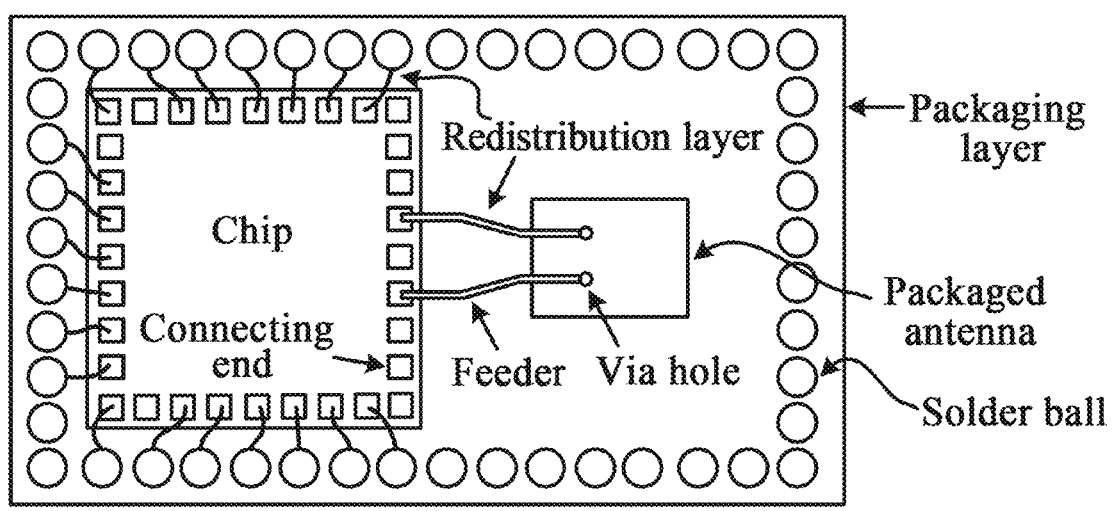
FIG. 2 is a bottom view of the dual-feed packaged antenna based on fan-out package in accordance with Embodiment 1 of the present disclosure.

As shown in FIG. 2, the antenna feed structure includes two feeders with the same length. A first end of each of the feeders is connected to a first end of one of two connecting ends of the chip through a first via hole, so as to connect to the connecting end of the chip. A second end of each of the feeders is connected to the packaged antenna through a second via hole. The second via hole for connecting the packaged antenna to the feeder is realized on the first passivation layer. Two second via holes respectively connected to the second ends are symmetrically distributed with respect to a center line of the packaged antenna. By selecting a suitable position on the packaged antenna, powers of multi-ports of the connecting end of the chip are combined on one antenna, thereby achieving the function of the passive power combiner.

As shown in FIG. 2, a solder ball array is provided on a lower end surface of the first passivation layer; solder balls in the solder ball array are arranged spaced apart; and the solder ball array is arranged around a periphery of the chip and the packaged antenna in a non-radiation direction. As for the packaged antenna, the solder ball array is configured to suppress a surface wave propagating in the dielectric layer as well as connect an earth terminal of a coplanar waveguide feed structure to the ground above the printed circuit board. As for the chip, the solder ball array mainly plays a role in connecting digit and analog pins of the chip to the printed circuit board to ensure signal integrity, and quickly dissipate the heat generated by the chip through the solder balls.

Figure 5:
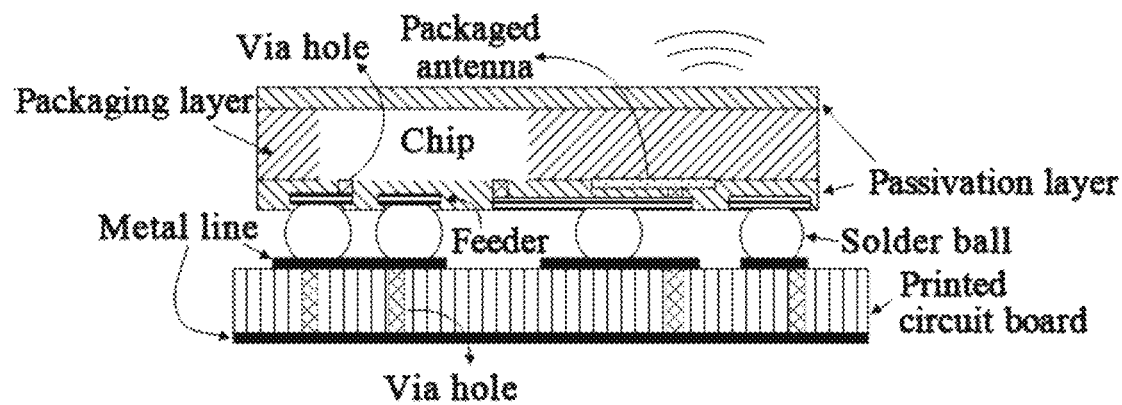
FIG. 5 schematically illustrates a connection between a multi-feed packaged antenna based on fan-out package and a printed circuit board in accordance with an embodiment of the present disclosure.

As shown in FIG. 5, the solder ball array is connected to a metal line on an external printed circuit board.

In order to increase the working bandwidth, left and right sides of the patch antenna are respectively provided with a parasitic patch (not shown in the drawings), which has little effect on the radiation performance of the antenna.

Figure 6:
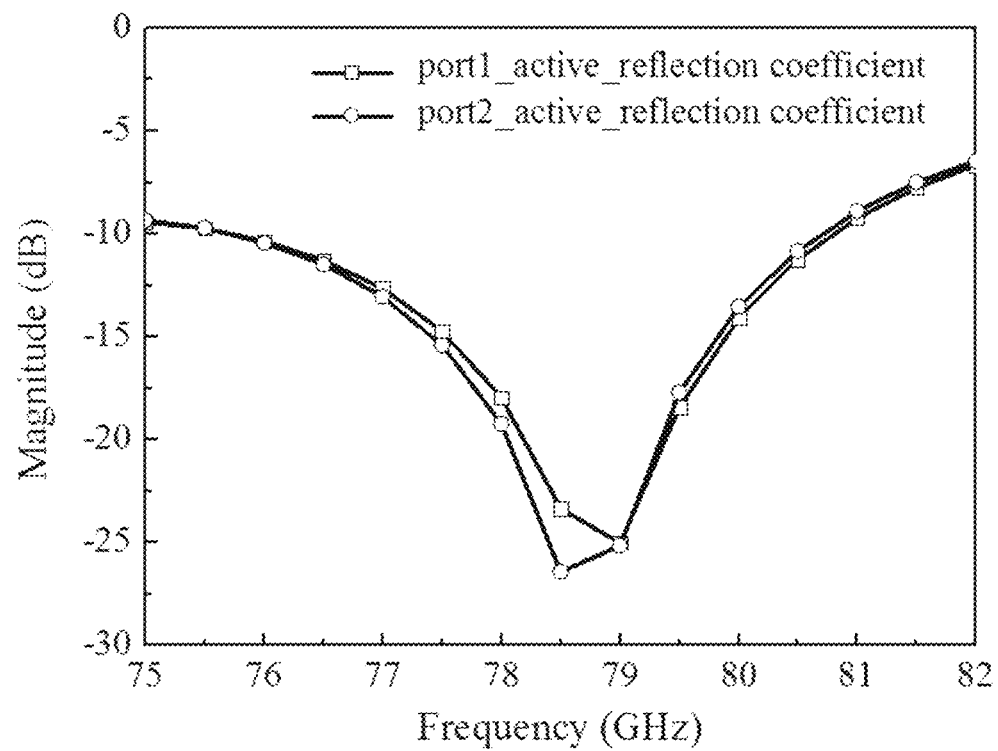
FIG. 6 schematically illustrates active emission coefficients of the dual-feed packaged antenna based on fan-out package in accordance with Embodiment 1 of the present disclosure.

FIG. 6 illustrates active reflection coefficients of the dual-feed packaged antenna based on fan-out package, from which it can be seen that an impedance bandwidth of the dual-feed antenna is about 6 GHz. The impedance bandwidth refers to a curve of S11 of the antenna changing with frequency, and the antenna bandwidth is normally defined as the frequency range at which S11 magnitude is below −10 dBs. It can be seen that the dual-feed antenna effectively covers 75-81 GHz.

Figure 7:
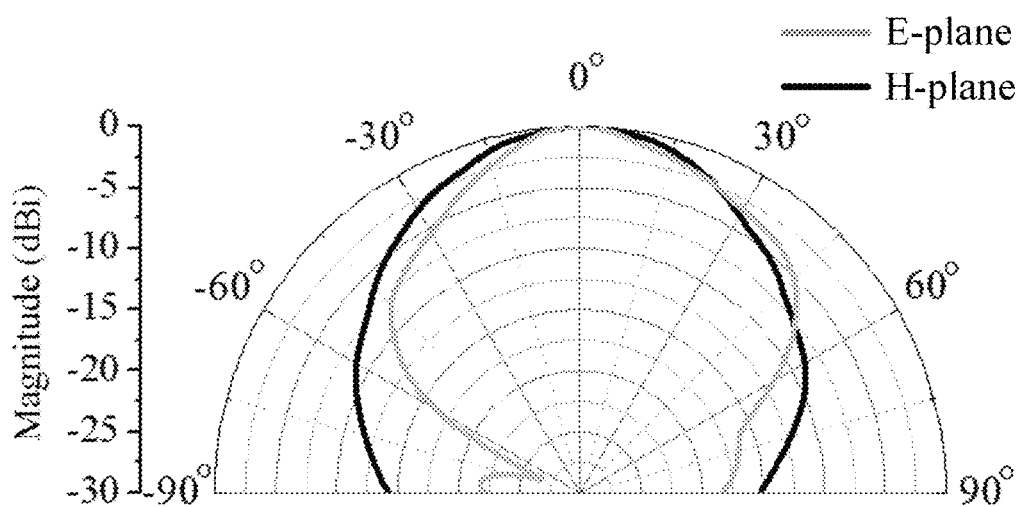
FIG. 7 is a radiation pattern of the dual-feed packaged antenna based on fan-out package in accordance with Embodiment 1 of the present disclosure.

FIG. 7 is a normalized radiation pattern of the dual-feed antenna, which is obtained when two feed ports are excited at the same time. It can be seen that a maximum radiation direction is close to 0°, indicating that the double feed antenna achieves the power combining.

Embodiment 2

Figure 3:
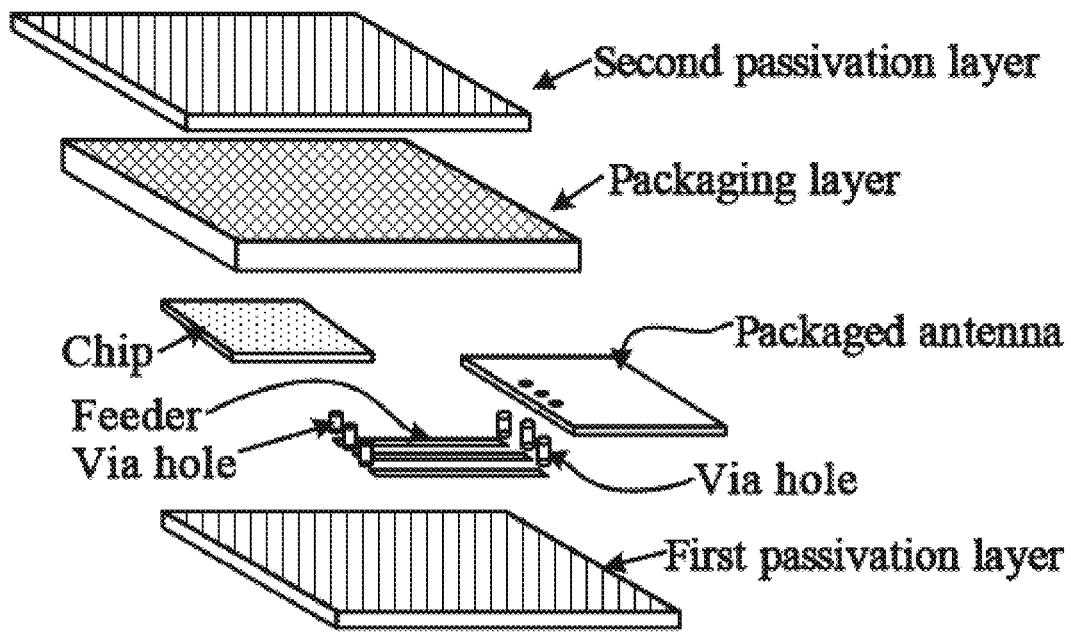
FIG. 3 is an explosive view of a triple-feed packaged antenna based on fan-out package in accordance with Embodiment 2 of the present disclosure.

As shown in FIG. 3, a triple-feed antenna is taken as an example for describing the disclosure.

The triple-feed packaged antenna based on fan-out package includes a packaging layer, a chip and a packaged antenna.

The chip is a millimeter-wave chip, and is embedded in the packaging layer with a side on which connecting ends of the chip are emerged. In an embodiment, a lower end surface of the chip is level with an upper end surface of the packaging layer.

During the traditional fan-out package, the packaging layer is made of plastic, and the physical performance of the chip can be improved by using a thicker packaging material. However, the plastic material for fan-out package has high processing cost and large loss, and has a lager curvature compared to glass. In the millimeter-wave frequency band, the plastic will impact the radiation performance of antenna in package (AIP). Due to a larger loss angle tangent value than glass, the plastic will lead to a weakened antenna gain. Therefore, the packaging layer used herein is made of glass. Compared to the plastic, the glass has lower loss and processing cost, and has a smaller curvature, thereby largely improving the performance of the packaged antenna and reducing the microsystem cost.

A first passivation layer is provided on the side on which the connecting ends of the chip are located, so that the side and the packaging layer are covered with the first passivation layer.

Preferably, an upper end surface of the chip is level with a lower end surface of the packaging layer. A second passivation layer is provided, so that the upper end surface of the packaging layer and the upper end surface of the chip are covered by the second passivation layer.

The first passivation layer includes a first redistribution layer and a second redistribution layer.

An antenna feed structure is provided in the first redistribution layer. A packaged antenna is arranged in the second redistribution layer. A plurality of connecting ends of the chip are connected to the packaged antenna in the second redistribution layer through the antenna feed structure in the first redistribution layer.

A solder pad of the chip is directly connected to the first redistribution layer through a via hole with a small height. If the antenna is placed on a top layer, due to the large height of the chip, the connection of the solder pad of the chip to the antenna on the top layer requires a via hole with a large height, resulting in a greater transition loss. By contrast, the fan-out package can effectively avoid such transition loss.

Figure 4:
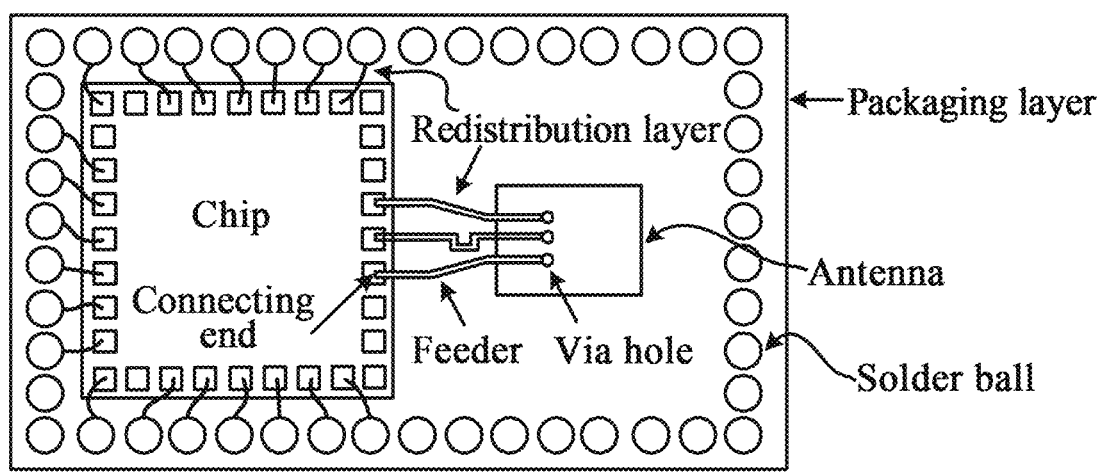
FIG. 4 is a bottom view of the triple-feed packaged antenna based on fan-out package in accordance with Embodiment 2 of the present disclosure.

Preferably, as shown in FIG. 4, the antenna feed structure includes three feeders with the same length. One end of the feeders is connected to three connecting ends of the chip through a first via hole. The other end of the three feeders is connected to the same triple-feed packaged antenna through a second via hole. The second via hole for connecting the packaged antenna to the feeder is realized on the first passivation layer. The first via holes connected to the packaged antenna are symmetrically distributed with respect to a center line of the packaged antenna. By selecting a suitable position on the packaged antenna, powers of multi-ports of the connecting end of the chip are combined on one antenna, thereby replacing the function of the passive power combiner.

As shown in FIG. 4, a solder ball array is provided on a lower end surface of the first passivation layer; solder balls in the solder ball array are arranged spaced apart; and the solder ball array is arranged around a periphery of the chip and the packaged antenna in a non-radiation direction. As for the packaged antenna, the solder ball array is configured to suppress a surface wave propagating in the dielectric layer as well as connect an earth terminal of a coplanar waveguide feed structure to the ground above the printed circuit board. As for the chip, the solder ball array mainly plays a role in connecting digit and analog pins of the chip to the printed circuit board to ensure signal integrity, and quickly dissipate the heat generated by the chip through the solder balls.

As shown in FIG. 5, the solder bally array is connected to a metal line on an external printed circuit board.

In order to increase the working bandwidth, left and right sides of the patch antenna are respectively provided with a parasitic patch (not shown in the drawings), which has little effect on the antenna radiation performance.

Figure 8:
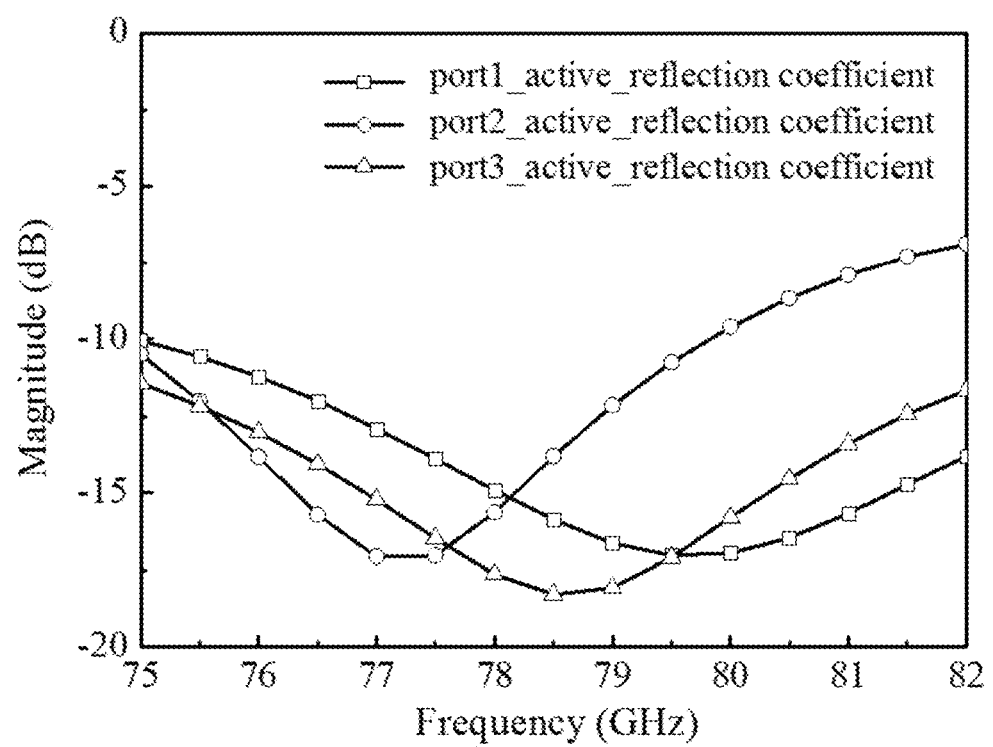
FIG. 8 schematically illustrates active emission coefficients of the triple-feed packaged antenna based on fan-out package in accordance with Embodiment 2 of the present disclosure.

FIG. 8 illustrates active reflection coefficients of the triple-feed packaged antenna based on fan-out package, from which it can be seen that an impedance bandwidth of the dual-feed antenna is about 6 GHz. The impedance bandwidth refers to a curve of S11 of the antenna changing with frequency, and the antenna bandwidth is normally defined as the frequency range at which S11 magnitude is below −10 dBs. It can be seen that the dual-feed antenna effectively covers 75-81 GHz.

Figure 9:
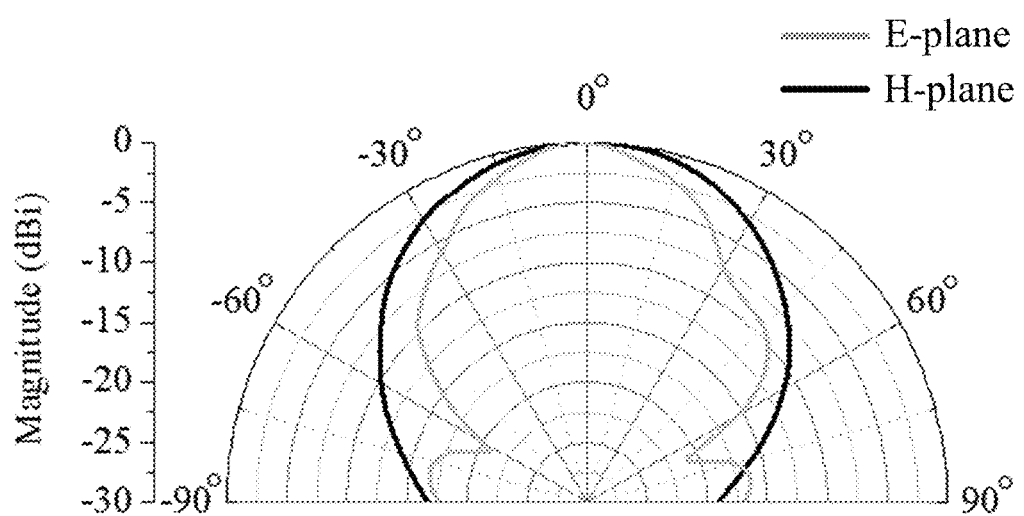
FIG. 9 is a radiation pattern of the triple-feed packaged antenna based on fan-out package in accordance with Embodiment 2 of the present disclosure.

FIG. 9 is a normalized radiation pattern of the triple-feed antenna based on fan-out package, which is obtained when two feed ports are excited at the same time. It can be seen that a maximum radiation direction is close to 0°, indicating that the triple-feed antenna achieves the power combining.

In summary, compared with the prior art, this disclosure has the following beneficial effects.

A first passivation layer is arranged below a packaging layer, and a first redistribution layer and a second redistribution layer are arranged on the first passivation layer to build the multi-feed packaged antenna. Connecting ends of multiple channels of a chip are connected to a feed structure of a packaged antenna. A metal layer of the antenna feed structure is achieved by the first redistribution layer, and the second redistribution layer is mainly configured to package the antenna. A coaxial feed method is adopted herein, in which two redistribution layers are provided with one layer used to realize the antenna and the other layer used for the feeders. In this way, the multi-port power combining can be achieved according to an electric field distribution of the antenna. On the one hand, a radiation pattern of the multi-feed packaged antenna is the same as that of a single antenna, having a wide-beam performance. In addition, a loss caused by a lossy power combine is eliminated and the defect of insufficient working bandwidth is overcome. On the other hand, the connecting ends of the chip are directly connected to a single antenna, and thus the working bandwidth of the connecting end is almost the same as that of the single antenna, effectively reducing the system volume and cost and improving an effective isotropic radiated power of the system.

In the disclosure, the plastic used in the traditional fan-out package is replaced with glass. The chip is embedded in the glass, and the first passivation layer and the second passivation layer are respectively arranged above and below the glass packaging layer to further increase a thickness of an isolation layer of the chip. Compared to the plastic, the glass has lower loss and processing cost, and has a smaller curvature, thereby largely improving the performance of the packaged antenna and reducing the microsystem cost.

Solder balls in A solder ball array are arranged spaced apart; and the solder ball array is arranged around a periphery of the chip and the packaged antenna in a non-radiation direction. As for the packaged antenna, the solder ball array is configured to suppress a surface wave propagating in the dielectric layer as well as connect an earth terminal of a coplanar waveguide feed structure to the ground above the printed circuit board. As for the chip, the solder ball array mainly plays a role in connecting digit and analog pins of the chip to the printed circuit board to ensure signal integrity, and quickly dissipate the heat generated by the chip through the solder balls.

It should be noted that based on the above description, those of ordinary skill in the art can clearly understand that the above embodiments can be implemented by means of software plus some necessary versatile hardware platforms. In view of this, the above technical solution can be embodied essentially in the form of a software product or the part that contributes to the prior art can be embodied in the form of a software product. The computer software product can be stored in a storage media, such as read-only memory (ROM)/random-access memory (RAM), magnetic discs, and compact discs, etc., and includes several instructions to enable a computer device (such as a personal computer, a server and a network device) to execute the methods described in each embodiment or some parts of the embodiment. As used herein, the terms such as "first" and "second" are only used to distinguish one entity or operation from another entity or operation, and do not necessarily require or imply any actual relationship or order between these entities or operations. Moreover, the terms "include", "comprise" or any other variants thereof are intended to mean the non-exclusive inclusion, and thus a process, method, product or device n not only includes those specified elements, but also includes other elements that are not clearly listed, or those elements inherent to this process, method, product or device. Unless otherwise specified, the element limited by the phrase "including a . . . " does not indicate the exclusion of other identical elements in the process, method, product or device including the element.

The above-mentioned embodiments are merely illustrative of the disclosure, and are not intended to limit this disclosure. It should be understood that changes, modifications and improvements made by those skilled in the art without departing from the spirit of the present disclosure shall fall within the scope of the present disclosure.

What is claimed is:

1. A multi-feed packaged antenna based on a fan-out package, comprising:
   a packaging layer; and
   a chip;
   wherein the chip is embedded in the packaging layer; and a first passivation layer is provided on a side where a plurality of connecting ends of the chip are located;
   the first passivation layer comprises a first redistribution layer and a second redistribution layer;
   an antenna feed structure is provided in the first redistribution layer;
   a packaged antenna is arranged in the second redistribution layer;
   the plurality of connecting ends of the chip are connected to the packaged antenna in the second redistribution layer through the antenna feed structure in the first redistribution layer;
   the antenna feed structure comprises a plurality of feeders corresponding to the plurality of connection ends of the chip; a first end of each of the plurality of feeders is connected to one of the plurality of connecting ends of the chip through one of a plurality of first via holes; a second end of each feeder of the plurality of feeders is connected to the packaged antenna through one of a plurality of second via holes; the plurality of feeders are the same length; and
   the packaged antenna is a dual-feed patch antenna, and two of the plurality of second via holes are symmetrically distributed with respect to a center line of the packaged antenna.

2. The multi-feed packaged antenna of claim 1, wherein the packaging layer is made of glass.

3. The multi-feed packaged antenna of claim 1, wherein a solder ball array is provided on a lower end surface of the first passivation layer; solder balls in the solder ball array are arranged spaced apart; and the solder ball array is arranged around a periphery of the chip and the packaged antenna.

4. The multi-feed packaged antenna of claim 3, wherein the solder ball array is connected to a metal line on an external printed circuit board.

5. A multi-feed packaged antenna based on a fan-out package, comprising:
   a packaging layer; and
   a chip;
   wherein the chip is embedded in the packaging layer; and a first passivation layer is provided on a side where a plurality of connecting ends of the chip are located;
   the first passivation layer comprises a first redistribution layer and a second redistribution layer;
   an antenna feed structure is provided in the first redistribution layer;
   a packaged antenna is arranged in the second redistribution layer;
   the plurality of connecting ends of the chip are connected to the packaged antenna in the second redistribution layer through the antenna feed structure in the first redistribution layer;
   the antenna feed structure comprises a plurality of feeders corresponding to the plurality of connection ends of the chip; a first end of each of the plurality of feeders is connected to one of the plurality of connecting ends of the chip through one of a plurality of first via holes; a second end of each feeder of the plurality of feeders is connected to the packaged antenna through one of a plurality of second via holes; the plurality of feeders are the same length; and
   the packaged antenna is a triple-feed patch antenna, and one of the plurality of second via holes is arranged on a center line of the packaged antenna, and two of the plurality of second via holes are symmetrically distributed with respect to the center line of the packaged antenna.

6. The multi-feed packaged antenna of claim 5, wherein the packaging layer is made of glass.

7. The multi-feed packaged antenna of claim 5, wherein a solder ball array is provided on a lower end surface of the first passivation layer; solder balls in the solder ball array are arranged spaced apart; and the solder ball array is arranged around a periphery of the chip and the packaged antenna.

8. The multi-feed packaged antenna of claim 7, wherein the solder ball array is connected to a metal line on an external printed circuit board.

* * * * *